(12) United States Patent
Wester

(10) Patent No.: US 6,207,947 B1
(45) Date of Patent: *Mar. 27, 2001

(54) USING DUV CURING TO FORM A PROTECTIVE COATING FOR COLOR FILTERS

(75) Inventor: Neil Wester, Tempe, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/040,626

(22) Filed: Mar. 18, 1998

(51) Int. Cl.$^7$ ........................................ G01J 3/50
(52) U.S. Cl. ............................ 250/226; 257/440
(58) Field of Search .................. 250/226, 216, 250/208.1; 257/432–440

(56) References Cited

U.S. PATENT DOCUMENTS

| | | | |
|---|---|---|---|
| 4,315,978 | * | 2/1982 | Hartman ................................ 257/440 |
| 4,600,833 | * | 7/1986 | Shibata et al. ......................... 250/216 |
| 5,889,277 | * | 3/1999 | Hawkins et al. ..................... 250/208.1 |

* cited by examiner

Primary Examiner—Que T. Le
(74) Attorney, Agent, or Firm—Blakely, Sokoloff, Taylor & Zafman LLP

(57) ABSTRACT

A structure and method for producing color filters with a protective highly cross-linked and densified polymer layer is described. In one embodiment, each filter is coated with a highly cross-linked and densified polymer layer to prevent bleeding of material between closely spaced filters during the fabrication process. In a second embodiment, the highly cross-linked and densified polymer layer is used to protect an array of filters from physical damage during detaping operations. In a third embodiment, the highly cross-linked and densified polymer layer is used before fabrication later filters in a color filter array to prevent damage to previous filter layers.

16 Claims, 2 Drawing Sheets

USING DUV CURING TO FORM A PROTECTIVE COATING FOR COLOR FILTERS

BACKGROUND OF THE INVENTION

(1) Field of the Invention

The present invention relates generally to the fabrication of color light detectors. More particularly, the present invention relates to the formation of protective coatings on filters used in color light detectors.

(2) Description of Related Art

Color light detectors are becoming increasingly important in digital imaging applications. Digital imaging systems often use arrays of photo-detectors to generate an image of a subject. In order to generate a color digital image, color filters are fabricated over light sensors such as photo-detectors. Each filter allows only a predetermined color of light (light in a particular frequency range) to reach a corresponding photo-detector thus determining what color light will be sensed by the photo-detector.

Each color pixel in a digital image is typically generated by combining the output of a set of photo-detectors. In one implementation, the output of three photo-detectors in a set are combined to generate one color pixel. Each photo-detector in a set is located in close proximity to the other two photo-detectors in the set. Each photo-detector of the set receives light filtered by a different colored color filter. In one example of a set, a blue color filter filters light reaching a first photo-detector, a red color filter filters light reaching a second photo-detector and a green color filter filters light reaching a third photo-detector. By determining the intensity of light passing through each color filter, the intensity of light of a particular color or wavelength can be determined. An electronic processor interpolates the data from the three photo-detectors and combines them to determine the color of light received by the photo-detectors in the general region of the pixel. This information is processed electronically and combined with other sets of photo-detectors to generate a digital color image.

Photo-detectors and color filters are typically formed in a complimentary metal oxide semiconductor (CMOS) fabrication process. A number of effects occur during the fabrication process that reduce the filtering capability or damage the color filters. In particular, three problems faced by the fabrication process are described in the following three paragraphs.

A first problem is color bleeding of compounds from adjacent color filters. Color filter arrays which are placed over the photo-detectors or imaging sensors are often generated by depositing pigment dispersed polymer films. The type of pigment determines the filtering capability of the filter. In a typical color detection system, adjacent filters have different pigments. The performance of the system is optimized when each photo sensor is covered with a single color filter, whether it be red, blue or green. The filter blocks other colors from passing through to the photo-sensor. Ideally, it is desirable to fabricate filters which transmit all of the light of a particular color and completely block other colors of light. Thus, for example, red pigments that determine the color of light that passes through a red filter are preferably completely confined to the red filter. In practice, the close contact between different color filters (red, blue, green) results in a slight intermixing of pigments ("bleed") during the fabrication process. The bleed results in a broadening of each individual filter response reducing the color delineation capabilities of each filter. This bleed degrades the overall performance of the system.

A second problem with current fabrication techniques is that during a grinding and gold deposition process (grind/gold process), color filters are often damaged. After the final deposition of CFA (color filter array) layer materials, wafers or substrates containing the color filters are transferred to a grind/gold process where a protective front side tape is applied to the wafer while the backside of the wafer is thinned and coated with gold. After completion of the grind/gold process, the tape is removed in a detaping operation. The filters are vulnerable to physical damage during the detaping operation. Damage to the color filters jeopardizes the functionality of the fabricated filter and photo-sensor combinations.

A third problem with current methods of fabricating filters results from repeating processing steps on the entire filter set each time a filter of a different color is added. After generation of a first color filter, each subsequent different color filter is produced by a subsequent deposition of a different pigmented polymer film in a subsequent layer. Thus a three color set (red, green and blue) of color filters involves three depositions of pigmented polymer films. Because each layer of pigmented polymer films is composed of similar materials, a misprocessing in the working or processing of a layer may damage previously created layers and require reworking of previously deposited layers.

Thus a method or apparatus of avoiding the above described problems is needed.

BRIEF SUMMARY OF THE INVENTION

A structure for detecting light is described. The structure includes first color filter deposited over a light sensor and a protective highly cross-linked and densified polymer layer around the first color filter.

DETAILED DESCRIPTION OF THE INVENTION

In accordance with one embodiment of the present invention, a protective highly cross-linked and densified polymer layer is formed between each different color filter layer. The protective layer protects and reduces the probability of damage to the color filters. For example, by using a protective layer, the detaping processes in grind/gold deposition processes damages fewer color filters. The protective layer is preferably formed by a densified and cross-linked surface polymer formed during a deep ultra-violet (DUV) curing process. The formation of the highly cross-linked and densified polymer layer between CFA layers also reduces the need for reworking of a previously deposited CFA layer when a subsequent CFA layer is misprocessed. Finally, the use of the highly cross-linked and densified polymer layer between adjacent color filters reduces bleeding of pigments or CFA polymer material between adjacent filters. Reducing bleeding improves the color selectivity of each filter.

In the accompanying description, certain details are provided to facilitate understanding of the invention. For example, the specification recites curing times as well as processing materials and wavelengths of ultraviolet light. However, it is recognized that other materials may be used and different curing times may be appropriate. The included details are provided to facilitate understanding of the invention and should not be interpreted to limit the scope of the invention. Certain details, for example, describing the steps used to create a photo-detector will be omitted, because such details would obscure the invention and are already well understood by those of ordinary skill in the art.

FIGS. 1A–1E and FIGS. 2A–2E illustrate simplified cross-sectional views of the color filter and protective layer or coating at various stages in processing. FIGS. 1A–1E show a simplified cross-sectional representation of a filter and protective layer when using the protective layer to reduce bleeding of pigment between adjacent filters. The embodiment shown in FIGS. 1A–1E also minimize the probability of having to "rework" previously created filters when a misprocessing step occurs.

Figure 1A:
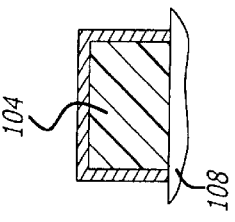
FIG. 1A–1E are cross-sections of a color filter array at various stages of a fabrication process in accordance with ore embodiment of the present invention.

CFA polymer 104 of FIG. 1A forms a color filter deposited over a substrate 108. The substrate 108 may be a silicon wafer. A light sensor such as a photo-detector device may be formed underneath the CFA polymer 104. The photo-detector may be formed between the substrate 108 and CFA polymer 104 or the photo-detector may be embedded into the substrate 108. The CFA polymer 104 may be deposited in a spin coating process. CFA polymer 104 typically includes a base polymer resin such as a polyacrylate containing single strands of polymer. A solvent typically puts the resin in a solution form and a photo sensitizer is used to cause cross-linking of the polymer strands. Organic metallic pigments are mixed with the resin. The type of pigment added determines the wavelengths of light filtered by the CFA polymer.

Figure 1B:
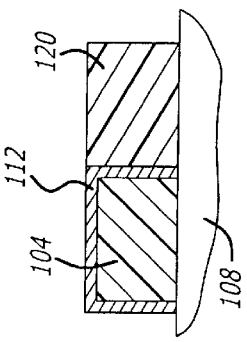

FIG. 1b illustrates the formation of a highly cross-linked and densified polymer layer 112 over the CFA polymer 104. In one embodiment, the highly cross-linked and densified polymer layer is formed by exposing the CFA polymer to ultra-violet light in a curing process. In the described embodiment, the curing process results in an oxidized resin of polymer material, including the densified cross-linked layer of polymer material. The cross linking and densification occurs during exposure to intense ultra-violet light. The exposure to ultra-violet light occurs during a ramped hard baking process in which the filter is heated to temperatures in excess of 200° C. In the preferred embodiment the resulting highly cross-linked and densified, polymer layer is only around 2/10 of a micron thick.

Figure 1C:
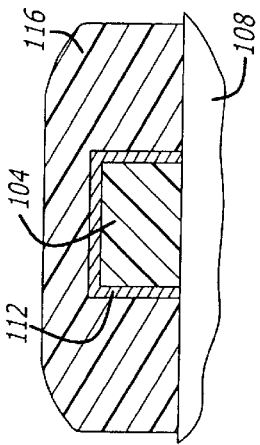
Figure 1D:
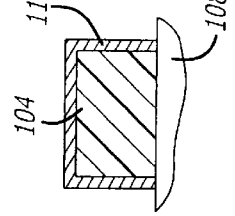

In order to form adjacent color filters, a second or subsequent layer of CFA polymer 116 is deposited over substrate 108 in a subsequent deposition process. The subsequent layer of CFA polymer 116 may surround the highly cross-linked and densified polymer layer 112 as illustrated in FIG. 1c. The subsequent layer of CFA polymer 116 contains different organo-metallic pigments than the initial CFA polymer 104. A photo definition process removes excess CFA polymer material in the subsequent layer resulting in a second filter 120 in close proximity to the first filter formed by CFA polymer 104 as illustrated in FIG. 1d. The second filter 120 and the first filter have different light transmission characteristics because of the different organo-metallic pigment incorporated into the polymer. The highly cross-linked and densified polymer layer 112 surrounding the first filter minimizes bleeding or intermixing of material between the second filter 120 and the first filter.

Figure 1E:
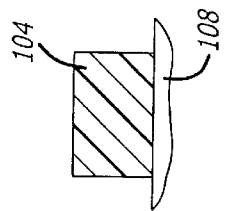

In the event of misprocessing, the highly cross-linked and densified polymer layer 112 allows removal of the second filter 120 of FIG. 11 without damaging the first filter formed by CFA polymer 104. After the second filter 120 is removed, the first filter with its protective highly cross-linked and densified polymer layer 112 is left intact as illustrated in FIG. 1e. In a typical set of photodetectors, second and third color filters are also fabricated around the original first filter.

FIG. 2 illustrates a cross-section of a filter array structure in an alternate embodiment of the present invention. The embodiment shown in FIG. 2 is suitable when multiple filters are used to filter the light incident on a sensor. FIG. 2A illustrates a first filter 204 formed over a photo-detector and a substrate 208. Exposing the first filter 204 to intense ultra-violet light during a ramped hard baking process results in the formation of a highly cross-linked and densified polymer layer 212 around first filter 204 as illustrated in FIG. 2b.

Figure 2A:
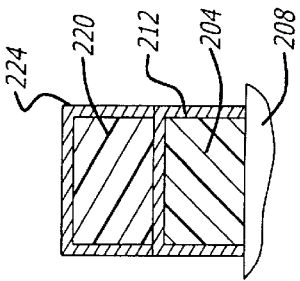
FIGS. 2A–2E are cross-sections of a color filter array at various stages of an alternative fabrication process.
Figure 2B:
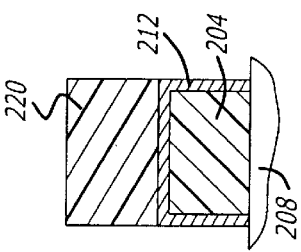
Figure 2C:
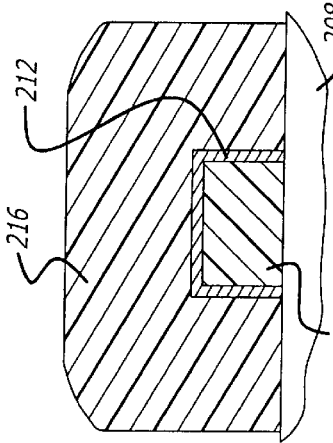
Figure 2D:
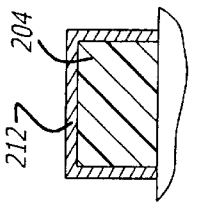
Figure 2E:
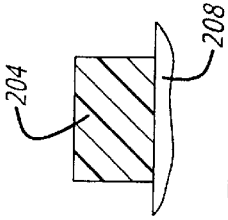

In FIG. 2c, a subsequent CFA polymer layer 216 is deposited over the first filter 204 and the first protective highly cross-linked and densified polymer layer 212. A photo definition process is performed to remove excess material resulting in a second filter 220 on top of the first filter 204 and highly cross-linked and densified polymer layer 212. The first highly cross-linked and densified polymer layer 212 prevents bleeding of pigment between the first filter 204 and the second filter 220. First highly cross-linked and densified polymer layer 212 also protects the first filter 204 from damage in the event of processing errors during fabrication of the second filter 220. To form a second highly cross-linked and densified polymer layer 224 over the second filter 220 as illustrated in FIG. 2e, the second filter 220 is exposed to ultra-violet light. After exposure to the ultra-violet light, both the first color filter 204 and the second color filter 220 are protected by corresponding highly cross-linked and densified polymer layers 212 and 224. Each highly cross-linked and densified polymer layer 212 and 224 is typically a few tenths of a micron thick and minimizes the chance of damage to the formed color filters 204, 220 during taping and subsequent detaping of the filter surface.

Figure 3:
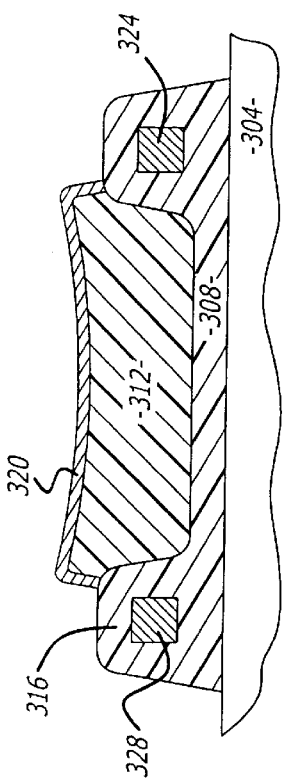
FIG. 3 is a cross-section of a device using a color filter in accordance with an embodiment of the present invention.

FIG. 3 illustrates a cross-section of a device using the formed color filters. Oxide layer 304 acts as a substrate supporting the detection apparatus. A light sensing device such as a semiconductor photo-detector is typically incorporated into the oxide or fabricated in a layer on the surface of the oxide 304. In the illustrated embodiment of FIG. 3, a silicon nitride layer 308 is grown on top of the oxide 304. A color filter 312 is formed in a well between metal lines 324, 328. A silicon nitride layer surrounds metal lines 324, 328. The color filter 312 is typically made of a polymer including a pigmented acrylate. The filter allows light of a predetermined frequency range to pass through. The color filter 312 blocks out other colors of light. A protective highly cross-linked and densified polymer layer 320 covers the color filter layer 312. It should be noted that the illustration shown is not to scale because the highly cross-linked and densified polymer layer 320 is typically only a few angstroms thick while the color filter 312 is typically a height of approximately 15,000 angstroms. Thus in a scaled drawing, the protective, highly cross-tinted and densified polymer layer 320 would barely be visible.

Highly cross-linked and densified polymer layer 320 serves as a protective coating and preferably has minimal optical effect. Thus highly cross-linked and densified polymer layer 320 preferably does not affect the light transmissivity of the color filter 312. Metal lines 324, 328 are typically composed of aluminum-silicon-copper alloy and in the illustrated embodiment are surrounded by silicon nitride material. In one embodiment of the invention the metal lines 324, 328 are used as contacts for connection to photodetectors under the filter 312.

In a preferred embodiment of the invention, three color filters, each color filter having a different color and corresponding to one of three photodetectors are used to generate a color image Each photodetector detects light in a corresponding frequency range. The set of three filters and detectors are coupled to processing electronics (not shown) that determine the approximate intensity of light in each frequency range in the general vicinity of the three photo sensors. In one embodiment, the processing electronics may be part of a graphics card in a personal computer. The information is interpolated by the electronics to determine the color and intensity of light striking the particular region or pixel.

Figure 4:
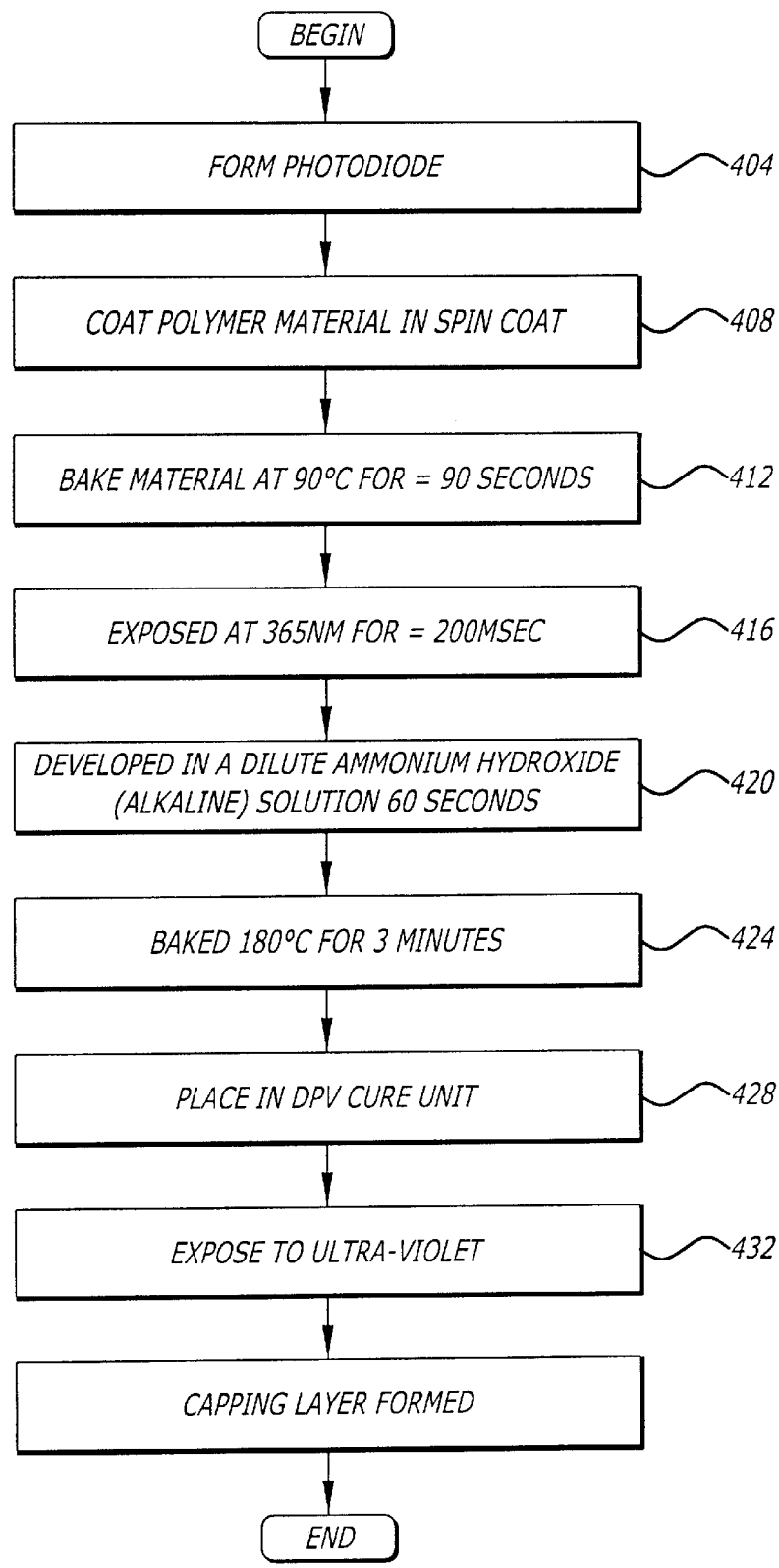
FIG. 4 is a flow diagram illustrating the steps used in fabricating color filters and protective layers around color filters in accordance with a method of the present invention.

FIG. 4 is a flow diagram illustrating the steps used in fabricating color filters and protective layers around color filters for use in light detecting devices. In step 404, a photo diode designed to detect light is formed on a substrate. Other non-organic structures such as metal lines may also be formed. The substrate typically includes a silicon oxide material. One example of a suitable substrate is a semiconductor wafer used in semiconductor processing. In step 408, a polymer coating for forming a filter is deposited on the substrate, preferably in a spin coating process. The polymer coating is typically a resin containing an organic metallic pigment that determines the light filtering characteristics of the polymer. In step 412, the material is baked at approximately 90° Celsius for approximately 90 seconds to cure the polymer coat.

To form device structures, a mask is placed over the polymer coating and the entire surface is exposed to light of approximately 365 nano-meters wavelength for approximately 200 milliseconds in step 410. The resulting material is developed in a developer solution to remove excess material in step 420. In one embodiment, the developer is a dilute ammonium hydroxide (alkaline) solution. The resulting structure is baked again in step 424 at approximately 180° centigrade for three minutes to cure the material. The formation of a first filter for filtering one color of light is thus completed.

In steps 428–432, a capping protective layer is formed over the color filter. The filter and accompanying substrate is placed in a second chamber or DUV cure unit in step 428. The DUV cure unit is commercially available from Fusion Systems, Inc. and is used in complementary metal oxide semiconductor (CMOS) processing.

In step 432 the color filter is hard baked and exposed to high-intensity ultra-violet light in a ramped hard baking process for approximately sixty seconds in a "curing" process. Typically in a ramped hard baking process, the temperature of the filter is raised from 22° C. to a temperature of 200° C. over a period of approximately sixty (60) seconds. It is preferred that the rise in temperature of the filter be ramped linearly upwards during the sixty second period. If a DUV (Deep Ultra-Violet) curing process is used, the wavelength of the light used ranges from 193 nano-meters to 248 nano-meters. The high-intensity of the UV light typically exceeds 200 watts/cm$^2$. During the curing process, the organic material along exposed perimeter of the filter absorbs the ultra-violet light causing a cross-linking and densification of perimeter material to form a highly cross-linked and densified polymer layer. In typical CMOS processes, exposure to ultra-violet light during a hard bake process is used to stabilize a photolithographic material prior to aggressive chemical processes such as implantation or etching. In CMOS process, this cross-linked polymer must typically be removed. In the present situation the cross-linked polymer layer serves as a protective highly cross-linked and densified polymer layer.

When prevention of bleeding between different colored filters is desired, the steps described in steps 408 through 432 may be repeated for each different color of filter implemented to form a highly cross-linked and densified polymer layer around each filter type. For example, a red, green, blue filter scheme may be formed by three repetitions of steps 408 through 432. During each repetition step 408 is modified to introduce a polymer material containing a different mix of pigment.

In an alternate embodiment, when the purpose of the highly cross-linked and densified polymer layer is merely to avoid damage during a detaping process, steps 408 through 432 need only be repeated once to cover all organic surfaces with a single highly cross-linked and densified polymer layer for the taping/detaping process. Performing step 428 through 432 once after all filters have been formed results in one highly cross-linked and densified polymer layer over all of the filters. A tape may then be applied to the entire surface to protect the surface while grinding other surfaces of the wafer and applying gold contacts. After completion of the grinding and gold contact application procedure, the tape, typically a cellophane tape, is removed. The highly cross-linked and densified polymer layer reduces the probability of damage to the underlying color filters during the de-tape process.

Once completed, each filter typically allows only predetermined wavelengths or colors of light to reach the photo diode. Using several photo diodes in close proximity, each photo diode receiving light filled by a different color filter, allowing a processor such as a graphics processor (not shown) to determine the color and intensity of light striking a small region. By using multiple sets of photo diodes in an array structure, a color image can be reconstructed.

While certain exemplary embodiments have been described in detail and shown in the accompanying drawings, it is to be understood that such embodiments are merely illustrative of and not restrictive on the broad invention. This invention is not to be limited to the specific arrangements and constructions shown and described herein; various other modifications may occur to those with ordinary skill in the art.

What is claimed:

1. A structure for detecting light comprising:
    at least one light sensor;
    a first color filter formed over the at least one light sensor, the first color filter being made of a polymer including a plurality of surfaces having a first highly cross-linked and densified polymer layer surrounding only the first color filter; and
    a second color filter formed over the at least one light sensor and adjacent to the first color filter, the second color filter being made of a polymer including a second pigmented acrylate including at least one surface having a second highly cross-linked and densified polymer layer surrounding only the second color filter.

2. The structure of claim 1 further comprising:
    a tape applied to the first and second protective highly cross-linked and densified polymer layers.

3. The structure of claim 1 wherein the first color filter blocks a different color light than the second color filter.

4. The structure of claim 1 wherein the first highly cross-linked and densified polymer layer and second highly cross-linked and densified polymer layer are non-overlapping when both of the first highly cross-linked and densified polymer layer and second highly cross-linked layer fail to cover one of the first and second color filters.

5. The structure of claim 1, wherein the first light sensor includes a semiconductor photo-detector.

6. A method of fabricating a light detecting structure comprising:

forming a first color filter over a first photodetector on a substrate;

exposing the first color filter to ultraviolet light during a hard bake process to form a first highly cross-linked and densified polymer layer surrounding only the first color filter;

forming a second color filter over the first color filter; and exposing the second color filter to ultraviolet light during a hard bake process to form a second highly cross-linked and densified polymer layer surrounding only the second color filter.

7. The method of claim 6 wherein the ultraviolet light has a wavelength between 193 nano-meters and 248 nano-meters.

8. The method of claim 7 wherein the ultraviolet light has an intensity that exceeds 200 watts per centimeter squared.

9. The method of claim 8 wherein the hard bake process includes raising a temperature of the first color filter from 22° C. to 200° C. over a predetermined time period.

10. The method of claim 6, wherein prior to forming the second color filter, the method further comprising:

applying a tape over the first highly cross-linked and densified polymer layer;

grinding the substrate of the light detecting structure; and removing the tape from the highly cross-linked and densified polymer layer.

11. The method of claim 6, wherein the second protective highly cross-linked and densified polymer layer covers all surfaces of the second color filter excluding a bottom surface covered by the first protective highly cross-linked and densified polymer layer.

12. The method of claim 6 further comprising:

forming a third color filter over a second photo-detector on the substrate, and adjacent to one of the first and second color filters; and exposing the third color filter to ultraviolet light during a hard bake process to form a third highly cross-linked and densified polymer layer surrounding only the third color filter, the third color filter filtering light of a different wavelength than the first and second color filters.

13. The method of claim 12 wherein during the hard bake process, the ultraviolet light has a wavelength between 193 nano-meters and 248 nano-meters.

14. The method of claim 13 wherein during the hard bake process, the ultraviolet light has an intensity that exceeds 200 watts per centimeter squared.

15. The method of claim 14 wherein during the hard bake process, a temperature is raised from approximately 22° C. to approximately 200° C. over a predetermined time period.

16. A structure for detecting light comprising:

at least one light sensor;

a first color filter formed over the at least one light sensor, the first color filter including a first highly cross-linked and densified polymer layer surrounding only the first color filter; and a second color filter formed over the at least one light sensor and adjacent to the first color filter, the second color filter including a second highly cross-linked and densified polymer layer surrounding only the second color filter.

* * * * *